United States Patent [19]

Moran

[11] Patent Number: 4,891,259
[45] Date of Patent: Jan. 2, 1990

[54] MULTILAYER SYSTEMS AND THEIR METHOD OF PRODUCTION

[76] Inventor: Peter L. Moran, 21 Windermere Drive, Alderley Edge, Cheshire SK8 7UP, United Kingdom

[21] Appl. No.: 195,348

[22] Filed: May 12, 1988

Related U.S. Application Data

[60] Continuation of Ser. No. 897,503, Aug. 18, 1986, abandoned, Division of Ser. No. 756,818, Jul. 18, 1985, Pat. No. 4,657,778.

[30] Foreign Application Priority Data

Aug. 1, 1984 [GB] United Kingdom ............... 8419649
Oct. 31, 1984 [GB] United Kingdom ............... 8427578

[51] Int. Cl.⁴ .............................................. B22B 3/00
[52] U.S. Cl. .................................. 428/209; 428/210; 428/620
[58] Field of Search ............. 428/209, 210, 620, 669; 427/96

[56] References Cited

U.S. PATENT DOCUMENTS

| | | | |
|---|---|---|---|
| 4,109,377 | 8/1978 | Blazick | 29/626 |
| 4,409,261 | 10/1983 | Kuo | 427/96 |
| 4,440,823 | 4/1984 | Hoffmann | 428/209 |
| 4,497,875 | 2/1985 | Arakawa | 428/620 |
| 4,503,112 | 3/1985 | Konicek | 428/216 |
| 4,568,562 | 2/1986 | Phillips | 427/98 |
| 4,606,788 | 8/1986 | Moran | 427/96 |

Primary Examiner—Shrive Beck
Assistant Examiner—Vi D. Dang
Attorney, Agent, or Firm—Christie, Parker & Hale

[57] ABSTRACT

A multilayer system comprises a seed layer (4) of copper deposited on an electrically insulating substrate (2). The seed layer (4) carries a copper pattern (8). An air fired dielectric (10) encapsulates the pattern (8) and the exposed parts of the seed layer (4). The outer skin of the pattern is oxidized as is also the whole of the seed layer other than where it underlies the copper pattern. The oxidized regions of the copper both form a firm bond with the dielectric and inhibit the migration of oxygen into the inner regions of the conductor pattern (8). Also the oxidation of the seed layer renders it non-conductive and therefore obviates the need for its removal. Through holes (12) produced in the dielectric enable electrical connection to the pattern (8).

11 Claims, 2 Drawing Sheets

MULTILAYER SYSTEMS AND THEIR METHOD OF PRODUCTION

CROSS-REFERENCES TO RELATED APPLICATIONS

This is a continuation of application Ser. No. 897,503, filed Aug. 18, 1986, now abandoned.

This application is a divisional application of U.S. Ser. No. 06/756 818 now U.S. Pat. No. 4,657,778 and the contents of the specification filed inconnection with that application are incorporated herein by reference.

BACKGROUND OF THE INVENTION

1. Field of the Invention

The present invention relates to multilayer systems.

2. Description of the Prior Art

Multilayer sytems take the form of a substrate which supports a plurality of layers of electrical conductors separated from one another by layers of insulation but selectively interconnected to one another by means of through connections in the layers of insulation.

In a previously proposed system each layer of conductors is formed on a substrate and covered with a dielectric layer which then forms the substrate for the next conductive layer. Through holes are formed in the dielectric layer to enable interconnections between adjacent conductive layers. Such through holes may be formed at the time of screen printing if the conductors are also screen printed or instead be formed later for example by laser drilling.

The conductive layer is formed by screen printing a thick film (as the technique is commonly known) of particulate conductive material on the substrate. The conductive film is then heated to promote sintering and adhesion of the layer to the substrate. Thereafter the whole is coated with a glass forming dielectric and then fired in a furnace at a temperature from the range of 600° C. and to 900° C. to melt the dielectric and to promote adhesion of the dielectric to the substrate. The conductive material may be of copper or copper based materials. The screen printing process is, however, generally limited in resolution. Copper and copper based materials, because they are deposited as small particles and not as a solid layer, are subject to oxidation throughout the layer and therefore require processing in an inert environment for example of nitrogen to inhibit oxidation. In this case dielectric glass forming materials must also be processed in a nitrogen environment and these are generally difficult to fabricate.

Furnaces providing a nitrogen environment are complex and expensive to run. Not all dielectrics are suitable for firing in a nitrogen environment, and those that are tend to become somewhat porous. Even if the insulator is built up layer by layer the desired density is not achieved and the insulator remains porous.

It is an object of the invention to provide an improved multilayer system.

SUMMARY OF THE INVENTION

According to the invention there is provided a multilayer structure comprising a substrate having at least one surface composed of an electrically insulating matrial, a solid pattern of an oxidisable electrically conductive material bonded to said surface and a coating of an air firing dielectric both on said pattern and that part of said surface not bonded to said pattern.

BRIEF DESCRIPTION OF THE DRAWINGS

A multilayer system and method of producing the system will now be described, by way of example, with reference to the accompanying diagrammatic drawings in which.

DESCRIPTION OF THE PREFERRED EMBODIMENT

The improved multilayer system and method of making the system to be described is particularly concerned with the production of a lower conductive layer and insulator in a multilayer (at least two layers) system. The conductive material is selected to be compatible with air firing glass insulators and to allow very high definition conductive patterns to be formed. The conductive material is preferably low cost copper.

Figure 1:
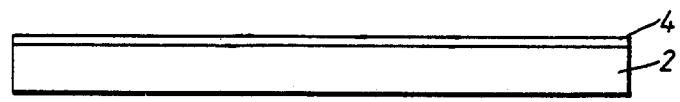
FIGS. 1 to 6 are sections through the system at different stages of production.

As shown in FIG. 1 a solid layer of copper 4 is formed on a substrate 2 of a ceramic, a glass, or glass-ceramic material or a coating of one of their materials on a metal sheet material to a thickness in the range of from 0.25 to 0.75 $\mu$m (micrometres). The formation of the copper layer is effected by introducing palladium on to the surface of the substrate and then effecting an electroless deposition of copper.

Figure 2:
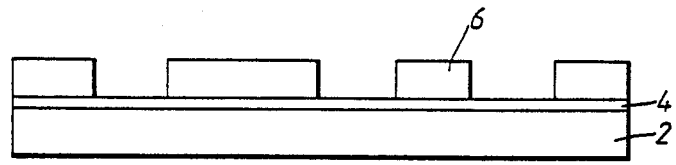

The copper layer 4 is then coated with an electrical resist 6 to a thickness in the range of from 12 to 50 $\mu$m, preferably 25 $\mu$m. The resist is exposed to a light pattern corresponding to a desired conductor pattern. The resist is then selectively removed with an etching fluid (see FIG. 2) to selectively expose the copper layer 4 underneath.

The exposed copper layer 4 is then electroplated with solid copper to a thickness of 7 $\mu$m and the residual resist is removed in a manner well known in the art. The result as shown in FIG. 3 is that a thick conductor pattern 8 is built up on a thin conductive layer.

Figure 3:
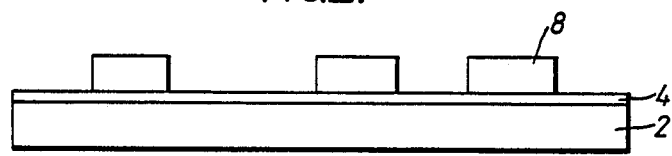

A thick film air-firing dielectric (for example 45 $\mu$m thick) 10 is then deposited to cover the copper layers 4 and 8 (see FIG. 3). The entire assembly is then fired in air at a temperature of between 600°–900° C. so as to form a dense glass based electrical insulator.

The dielectric is preferably deposited by a screen printing process. The dielectric preferably takes the form of particles of glass suspended in ethyl cellulose dissolved in butyl carbitol. After screen printing the dielectric is dried to evaporate the butyl carbitol. The ethyl cellulose then acts as a binder for the glass particles. When the dielectric is fired the ethyl cellulose burns off and the glass melts or fuses to form a dense substantially non-porous layer.

Figure 4:
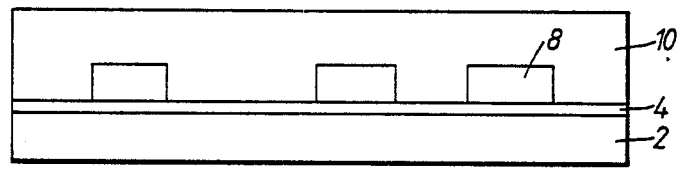
Figure 5:
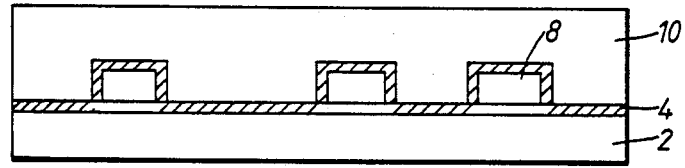

The firing step also has consequences for the underlying copper inasmuch as the copper is oxidised to a depth of about 2 $\mu$m (see FIG. 4). Because the depth to which the copper is oxidised depends upon such factors as the firing temperature, the glassiness of the insulator, and the melting temperature of the glass, care must be taken to ensure that oxidation takes place to the desired depth. The result is that the whole of the seed layer 4 not covered by the conductive layer 8 is oxidised to formed a non-conductive copper oxide while the solid conductors of the layer 8 which are 7 $\mu$m thick are oxidised only to depth of 2 $\mu$m and this does not appreciably effect the conductive properties of the conductors.

The net result is that the conductors are buried in an air firing dielectric. It will be appreciated that the oxidation of the outer skin of the solid conductors enables the insulator to become intimately bonded with the conductor. Furthermore the presence of a glass layer on the oxidised outer skin of the conductor inhibits further diffusion of oxygen from the insulator into the conductor.

Finally a through hole pattern is established in the dielectric layer 10 (see holes 12 in FIG. 6) to provide access to the conductors 8. The through holes 12 can be produced by laser drilling or by etching or abrading techniques.

The through holes 12 can be produced before the assembly is fired by screen printing methods, for example. Instead laser drilling and abrading or etching methods can be used.

It will be appreciated that the above described multilayer system provides a number of advantages.

The conversion of the copper seed layer into copper oxide provides a glass forming material which has a high adhesion with the substrate 2, the coppper conductors 8 and the dielectric 10. The adhesion of the copper conductors 8 to the substrate is also improved by the firing since a copper oxide bond is formed.

In effect the function of the oxidised copper seed layer is that during the firing step it should become non-conductive and glass-forming when combined with oxides such as PbO, BaO and $SiO_2$ present in the insulator. Thus the glass insulator when molten whets to the copper oxide seed layer and in effect dissolves it. The copper oxide seed layer also whets to the ceramic, glass or glass-ceramic substrate and complexes with it and so a very strong bond is formed between the insulator and the substrate.

In the absence of the copper oxide seed layer between the substrate and insulator a whetting agent could be included in the glass insulator to promote adhesion directly between the substrate and insulator.

The conversion of the seed layer to an electrical insulator avoids the need to remove those parts of the seed layer not underlying the copper conductors.

The need for the introduction of ionic aqueous materials is also avoided at any stage where they could effect the reliability of the system.

Figure 6:
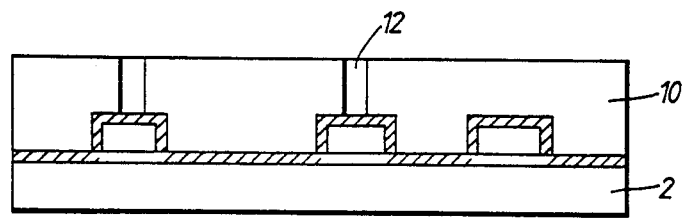
Figure 7:
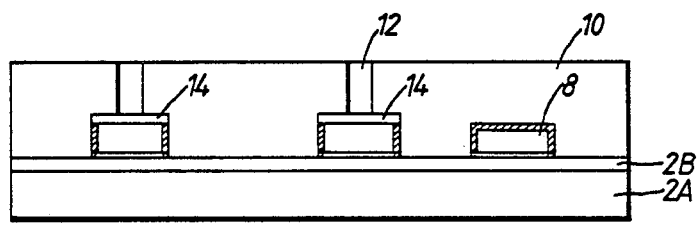
FIG. 7 is a section through a modified system.

In one modification of the described method following the step of electroplating with a copper layer 8 and prior to the step of removing the residual resist, the copper layer 8 is coated with a film 14 (see FIG. 7) of a metal which will inhibit diffusion of oxygen into the copper conductor 8. Metals particularly suitable for this purpose are nickel, palladium, gold, silver, chromium, rhodium or any alloy of these metals. The step has the effect of reducing the amount of copper converted into copper oxide advantageously during the air firing step. The diffusion inhibiting film is particularly needed to coat the copper areas where the through holes are formed since otherwise such areas would be always exposed to the air and therefore subject to oxidation. In FIG. 7 parts similar to those in FIG. 6 are similarly referenced.

In yet a further modification, the oxidation inhibiting layer is coated with a thin film of copper to act as an adhesion layer between the oxidation inhibiting layer and the dielectric following the firing of the system.

In yet another modification two resist steps and two copper plating steps are effected prior to the removal of the excess resist and the covering of the conductors 10 with dielectric. The first resist is a thin layer formed by spinning a wet film resist to produce very high definition tracks (for example having a width of 10 $\mu$m and a thickness of 4 $\mu$m). The second resist is a thick layer deposited using a laminated dry film resist to produce features such as tracks 25 $\mu$m thick and 35 $\mu$m wide or sites over which the through holes will be formed in the insulator.

While the seed layer 4 is described as being formed by electroless deposition it will be appreciated that it can equally be formed by a thin film or a metallorganic method.

Furthermore instead of copper, any other electrically conductive material can be used which has the dual properties of, upon oxidation, becoming both non-conductive and of ceramic or glassy form to provide a strong adhesive bond with ceramic, glass or glass-ceramic substrates and dielectric covering layers.

It will be appreciated that the multilayer system can be double-sided. In such systems the substrate is provided with a plurality of through holes and a conductive layer is formed on both sides of the substrate simultaneously. At the same time conductive material is deposited in the through holes to link the two conductive layers.

While in the embodiment described the seed layer is left in tact on the sustrate throughout the process it will of course be appreciated that it can be removed from areas other than directly under the conductive pattern prior to the dielectric deposition step. In this event the material of the seed layer need not be oxidisable.

Also instead of forming the electrically conductive pattern on the substrate with the aid of the seed layer it can be formed by other methods.

In one method the conductive pattern is formed by sputtering or evaporation of the conductor through a mask. Instead the substrate is uniformly coated by sputtering or evaporation and the conductive material selectively removed by wet etching of by sputter or plasma etching to leave the required pattern.

In another method the conductive pattern is formed on the substrate by an electroless plating method guided by a resist using a catalyst such as palladium. Instead an auto catalysing electroless plating process can be used.

In yet another method a sheet of conductive material is directly bonded to the substrate at high temperature to form a chemical bond. An electrically conductive pattern would then be produced by selective removal of the material with the aid of a resist.

In each case the dimensions of the electrically conductive material both in depth and width would have to be substantially greater than the depth to which the conductive material whets or complexes with the glass insulator during the air firing step.

It will be appreciated that the use of a dielectric which is fired in air provides significant advantages over dielectrics fired in an inert environment, for example, in a nitrogen environment.

The range of dielectrics which can be readily used is significantly increased over that which could be used in a nitrogen environment. The dielectrics fired in air are generally more dense primarily due to the increased amount of free oxygen available during the firing step.

When the substrate is a ceramic it is preferably one selected from the group consisting of alumina, aluminium nitride and silicon carbide.

When the substrate is an insulated metal, the metal is preferably one selected from the group consisting of stainless steel, low carbon steel and copper. Such a substrate is shown in FIG. 7 in which a metal sheet 2A is coated with an electrically insulating layer 2B.

The term "multilayer" as used in the present specification is intended to emcompass two layers or more.

Many modifications can be made to the invention without departing from the spirit and scope of the invention as defined by the appended claims.

I claim:

1. An electrical device comprising a multilayer structure, said multilayer structure comprising:
   a substrate having at least one surface composed of an electrically insulating material;
   a solid pattern of electrically conductive material bonded to said surface, the surface only of the pattern being superficially oxidised; and
   a coating of an air firing glassy insulator fused both on said superficially oxidised surface of the pattern and on that part of said substrate surface not bonded to said pattern.

2. A device according to claim 1 wherein said electrically conductive material comprises copper.

3. A device according to claim 1 wherein said pattern is bonded to said surface by a seed layer of the same material as said pattern.

4. A device according to claim 1 wherein said substrate comprises a metal sheet coated with an electrically insulating material.

5. A device according to claim 1 wherein said substrate comprises a ceramic.

6. A device according to claim 1 wherein said substrate comprises a glass material.

7. A device according to claim 1 including a layer of palladium between the substrate and the solid pattern of oxidisable electrically conductive material.

8. A device according to claim 1 wherein the solid pattern of oxidisable electrically conductive material comprises two layers of said material of different thickness, the thinner layer being located between the thicker layer and the substrate.

9. A structure according to claim 1 wherein the solid pattern of oxidisable electrically conductive material includes an outer oxidised layer having a thickness of the order of 2 $\mu$m.

10. A device according to claim 1 including a diffusion inhibitor located between the solid pattern of oxidisable electrically conductive material and the coating.

11. A device according to claim 10 wherein the infusion inhibitor is selected from the group consisting of nickel, palladium, gold, silver, chromium, rhodium or an alloy of any of these materials.

* * * * *